United States Patent
Shim et al.

(10) Patent No.: US 10,084,019 B2
(45) Date of Patent: Sep. 25, 2018

(54) ORGANIC LIGHT-EMITTING ARRAY AND ORGANIC LIGHT-EMITTING DISPLAY DEVICE USING THE SAME

(71) Applicant: LG DISPLAY CO., LTD., Seoul (KR)

(72) Inventors: Sung-Bin Shim, Yangsan-si (KR); Eui-Doo Do, Paju-si (KR); Moon-Bae Gee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/689,687

(22) Filed: Aug. 29, 2017

(65) Prior Publication Data
US 2018/0061904 A1 Mar. 1, 2018

(30) Foreign Application Priority Data
Aug. 31, 2016 (KR) .................. 10-2016-0112243

(51) Int. Cl.
*H01L 27/32* (2006.01)
*H01L 51/05* (2006.01)
*H01L 51/10* (2006.01)

(52) U.S. Cl.
CPC ...... *H01L 27/3211* (2013.01); *H01L 27/3206* (2013.01); *H01L 27/3246* (2013.01); *H01L 51/0508* (2013.01); *H01L 51/102* (2013.01)

(58) Field of Classification Search
CPC ............. H01L 27/3211; H01L 27/3206; H01L 27/3246; H01L 51/0508; H01L 51/102
See application file for complete search history.

(56) References Cited

U.S. PATENT DOCUMENTS

| 2005/0161740 | A1* | 7/2005 | Park ..................... H01L 27/1214 257/347 |
| 2007/0215888 | A1* | 9/2007 | Mitsuhashi .......... G09G 3/3225 257/94 |
| 2014/0138663 | A1* | 5/2014 | Aratani ............... H01L 51/0085 257/40 |
| 2014/0183479 | A1* | 7/2014 | Park ........................ H01L 51/56 257/40 |
| 2015/0179719 | A1 | 6/2015 | Nam et al. |
| 2016/0079325 | A1* | 3/2016 | Lee ..................... H01L 27/3246 257/40 |

FOREIGN PATENT DOCUMENTS

EP 3125294 A1 2/2017

* cited by examiner

*Primary Examiner* — Karen Kusumakar
(74) *Attorney, Agent, or Firm* — Birch, Stewart, Kolasch & Birch, LLP

(57) ABSTRACT

Disclosed are an organic light-emitting array and an organic light-emitting display device using the organic light-emitting array. The organic light-emitting array includes a substrate having a plurality of sub-pixels, each sub-pixel including an emission portion and a non-emission portion adjacent the emission portion; a first electrode provided on at least the emission portion and provided on a portion of the non-emission portion for each sub-pixel; a bank provided in the non-emission portion and having a positively tapered portion configured to overlap a portion of the first electrode and a negatively tapered portion configured so as not to overlap the first electrode; an organic layer provided on the first electrode and the bank; and a second electrode disposed on the organic layer over the plurality of sub-pixels.

20 Claims, 15 Drawing Sheets

| Non-Emission portion | Emission portion | Non-Emission portion |

Non-Emission portion | Emission portion | Non-Emission portion

Non-Emission portion | Emission portion | Non-Emission portion

ORGANIC LIGHT-EMITTING ARRAY AND ORGANIC LIGHT-EMITTING DISPLAY DEVICE USING THE SAME

CROSS-REFERENCE TO RELATED APPLICATION

This application claims the priority benefit of Korean Patent Application No. 10-2016-0112243, filed on Aug. 31, 2016, the disclosure of which is incorporated herein by reference in its entirety.

BACKGROUND OF THE INVENTION

Field of the Invention

Embodiments of the present invention relate to an organic light-emitting element, and more particularly, to an organic light-emitting array, which prevents lateral current leakage of sub-pixels by changing the structure thereof, and an organic light-emitting display device using the same.

Discussion of the Related Art

Recently, as the information age has fully arrived, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered a competitive application because it does not require a separate light source and enables realization of a compact device design and vivid color display.

The organic light-emitting display device includes self-luminous elements, such as organic light-emitting elements, provided in sub-pixels, and performs display via operation of the organic light-emitting elements on a per sub-pixel basis. In addition, the organic light-emitting elements may be used in a lighting apparatus because they are self-luminous elements, in addition to the display device, and thus the development of organic light-emitting elements has recently been in the spotlight in the lighting industry. In addition, because the organic light-emitting elements require no separate light source unit, they are also advantageously used in a flexible display device or a transparent display device.

Meanwhile, such an organic light-emitting element includes an organic emission layer between an anode and a cathode. In addition, electrons and holes are respectively injected into the organic emission layer from the anode and the cathode, and excitons are produced in the organic emission layer via combination of the electrons and holes. Then, when the produced excitons fall down or move from the excited state to the ground state, light is generated from the organic light-emitting element.

Meanwhile, the organic light-emitting display device includes an organic light-emitting array, which includes, for example, red, green and blue sub-pixels for the display of various colors. In addition, although the organic light-emitting array may be configured in various forms, a tandem type has recently been proposed, in which an anode is formed on a substrate for each sub-pixel, and subsequently a thin organic layer including an organic emission layer and a cathode are formed on an entirety of an array area.

However, in the instance of the tandem type, there occurs current leakage between neighboring sub-pixels since the thin organic layer between the anode and the cathode is provided over the entire array area.

Hereinafter, the problem of a conventional organic light-emitting array in an organic light-emitting display device will be described.

FIG. 1 is a schematic cross-sectional view illustrating a current leakage phenomenon that occurs at the boundary of neighboring sub-pixels of a related art organic light-emitting array.

As illustrated in FIG. 1, in the related art organic light-emitting array, an anode 11 is provided on a substrate 10 for each sub-pixel, and a bank 12 is located to overlap the respective anodes 11 of neighboring sub-pixels in order to define an emission portion. In addition, without distinguishing between the emission portion and a non-emission portion, a thin organic layer 13 is formed on the anode 11 and the bank 12, and a cathode 14 is formed on the thin organic layer 13.

Here, the thin organic layer 13 is an organic semiconductor, and functions as a dielectric substance of an organic light-emitting diode in each sub-pixel by causing vertical current to flow between the anode 11 and the cathode 14. However, since the thin organic layer 13 is also provided on the bank 12 between the neighboring sub-pixels and is connected to the respective sub-pixels, the upwardly transferred current may flow laterally to the neighboring sub-pixels, as illustrated in FIG. 1, causing lateral current leakage.

SUMMARY OF THE INVENTION

Accordingly, the embodiments of the present invention are directed to an organic light-emitting array and an organic light-emitting display device using the same that substantially obviate one or more problems due to limitations and disadvantages of the related art.

An object of the present invention is to provide an organic light-emitting array, which prevents lateral current leakage between sub-pixels by changing the structure thereof, and an organic light-emitting display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in an organic light-emitting array according to the present invention, a bank does not have a symmetrically tapered shape, but has a shape in which one side thereof close to an emission portion is positively tapered and the other side thereof distant from the emission portion is inversely (negatively) tapered so that an organic layer located on the inversely tapered side of the bank undergoes structural disconnection, whereby lateral current leakage due to the organic layer may be prevented or reduced.

According to an embodiment of the present invention, an organic light-emitting array includes a substrate in which a plurality of sub-pixels, each including an emission portion and a non-emission portion adjacent the emission portion, is defined, a first electrode provided on at least the emission portion and provided on a portion of the non-emission portion for each sub-pixel, a bank provided in the non-emission portion and having a positively tapered portion configured to overlap a portion of the first electrode and a negatively tapered portion configured so as not to overlap the first electrode, an organic layer provided on the first electrode and the bank, the organic layer being separated on the negatively tapered portion of the bank between neighboring sub-pixels, and a second electrode disposed on the organic layer formed over the sub-pixels.

In addition, the organic light-emitting array may further include an overcoat layer as an interlayer between the substrate and the first electrode, the overcoat layer having a concave area formed in a portion of a thickness thereof so as to correspond to the non-emission portion.

The negatively tapered portion of the bank may be provided in a region in which the bank and the concave area of the overcoat layer overlap each other.

The bank may be formed of a light-shielding material.

The organic layer may include one or more organic emission layers, and common organic layers located respectively under and above the organic emission layers.

The bank may include a portion having a flat top between the positively tapered portion and the negatively tapered portion.

The organic layer may be located only in a region of the concave area of the overcoat layer that does not overlap the bank. The organic light-emitting array may further include an auxiliary wire provided in the concave area so that a portion thereof overlaps the negatively tapered portion of the bank, the auxiliary wire being formed of the same material as the first electrode. The second electrode may be connected to the auxiliary wire in a region in which a portion of the second electrode overlaps the negatively tapered portion of the bank inside the concave area.

In addition, a thin-film transistor may be provided on the substrate in each sub-pixel so as to be connected to the first electrode so that the organic light-emitting array may be used in an organic light-emitting display device.

It is to be understood that both the foregoing general description and the following detailed description of the present invention are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
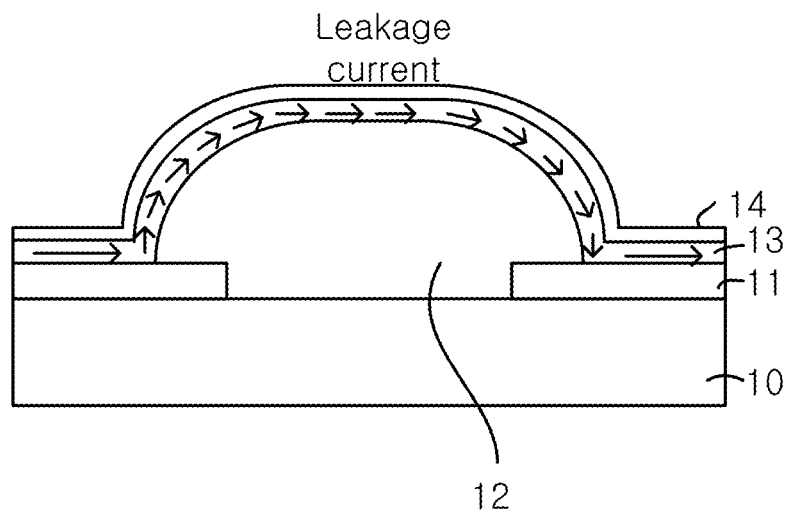
FIG. 1 is a schematic cross-sectional view illustrating a current leakage phenomenon that occurs at the boundary of neighboring sub-pixels of a related art organic light-emitting array.

Hereinafter, the embodiments of the present invention will be described in detail with reference to the accompanying drawings.

The embodiments described below are merely provided by way of example in order to allow the spirit of the present invention to be sufficiently apprised to those skilled in the art. Thus, the present invention is not limited to the embodiments described below and may be embodied in other forms. In addition, in the drawings, for example, sizes and thicknesses of constituent elements of a device may be exaggerated for convenience. The same reference numbers will be used throughout the specification to refer to the same or like constituent elements.

The advantages and features of the embodiments of the present invention and the way of attaining them will become apparent with reference to embodiments described below in detail in conjunction with the accompanying drawings. The invention, however, may be embodied in many different forms and should not be constructed as being limited to example embodiments set forth herein. Rather, these example embodiments are provided so that this disclosure will be thorough and complete and will fully convey the scope to those skilled in the art. The scope of the embodiments of the present invention should be defined by the claims. Wherever possible, the same reference numbers will be used throughout the drawings to refer to the same or like parts. In the drawings, the sizes of layers and regions and the relative sizes thereof may be exaggerated for clarity of description.

It will be understood that, when an element or a layer is referred to as being "on" another element or layer, it can be directly on the other element or intervening elements may also be present. In contrast, when an element is referred to as being "directly on" another component, there are no intervening components present.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. For example, when an element illustrated in the drawing is inverted, an element, which is described as being disposed "below" or "beneath" another element, may be disposed above the other element. Thus, the term "below" may include both upward and downward directions.

The terminology used herein is for the purpose of describing particular example embodiments only and is not intended to be limiting. As used herein, the singular forms are intended to include the plural forms as well, unless the context clearly indicates otherwise. It will be further understood that the terms "comprises" and/or "comprising" "includes," and/or "including," when used in this specification, specify the presence of stated elements, steps, operations and/or components, but do not preclude the presence or addition of one or more other elements, steps, operations and/or components.

Meanwhile, an organic light-emitting display device of the present invention may be divided into an array area in which display is implemented and a peripheral area therearound. The array area includes an organic light-emitting array and a thin-film transistor array, which have an electrical connection relationship therebetween, and the peripheral area includes a pad area, which is electrically connected to the organic light-emitting array and the thin-film transistor array, and a circuit, which is connected to the pad area.

The feature of the present invention is in the configuration of the organic light-emitting array, and the following description is focused on the configuration of the organic light-emitting array.

Figure 2:
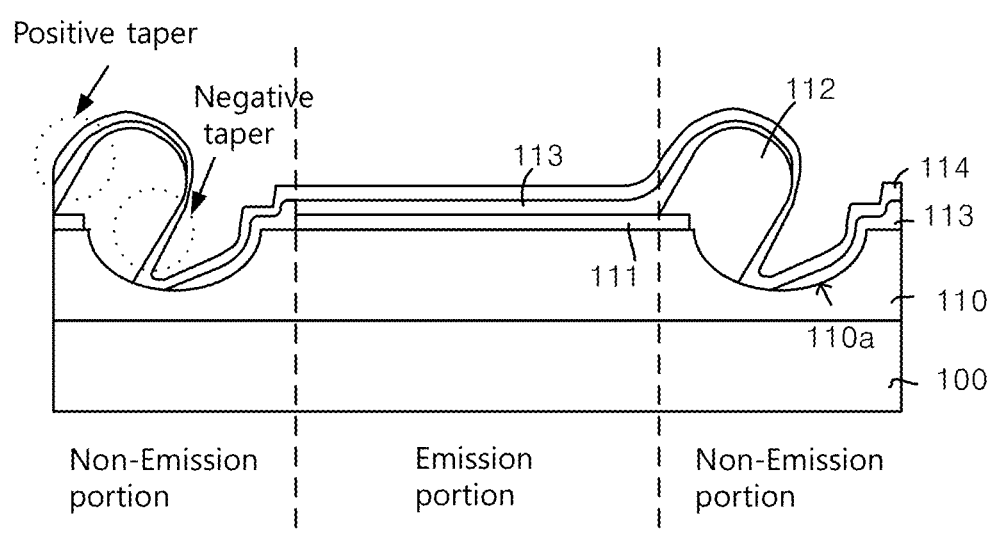
FIG. 2 is a cross-sectional view illustrating an organic light-emitting array according to a first embodiment of the present invention.

FIG. 2 is a cross-sectional view illustrating an organic light-emitting array according to a first embodiment of the present invention.

As illustrated in FIG. 2, the organic light-emitting array of the present invention includes a substrate 100 in which a plurality of sub-pixels, each having an emission portion and a non-emission portion around the emission portion, is defined, a first electrode 111 provided to fill (or cover) at least the emission portion and provided on a portion of the non-emission portion for each sub-pixel, a bank 112 provided in the non-emission portion and having a positively tapered portion that overlaps a portion of the first electrode 111 and an inversely (or a negatively) tapered portion that does not overlap the first electrode 111, an organic layer 113 provided along the top of the first electrode 111 and the bank 112, the organic layer 113 being separated in a region between neighboring sub-pixels on the inversely tapered portion of the bank 112, and a second electrode 114 disposed on the organic layer 113 so as to be integrally formed over the plurality of sub-pixels.

Here, the organic light-emitting array further includes an overcoat layer 110 as an interlayer between the substrate 100 and the first electrode 111, the overcoat layer 110 having a concave area 110a formed in a portion of the thickness thereof so as to correspond to the non-emission portion. Through the provision of the overcoat layer 110, the degree of tapering of the bank 112 to be formed may be adjusted.

For example, the concave area 110a included in the overcoat layer 110 is defined by removing a portion of the surface of the overcoat layer 110 relative to the overall thickness thereof. The concave area 110a may be formed simultaneously with the process of forming a contact hole by removing the overcoat layer 110 to achieve a total thickness thereof for facilitating connection between the first electrode 111 disposed on the overcoat layer 110 and a driving thin-film transistor disposed under the overcoat layer 110 (see FIGS. 12 and 13). In order to attain a gentle profile on the side surface of the concave area 110a, a mask, which is used to form the contact hole in the overcoat layer 110, includes a diffraction area that corresponds to the concave area 110a, thereby causing only a portion of the surface of the overcoat layer 110 to be removed so as to have a gentle profile (see FIG. 9).

In this instance, when the bank 112 is formed to overlap the concave area 110a, an overlapped portion of the bank 112 is inversely tapered. This is because, in the process of forming the bank 112, even if the constituent material of the bank 112 is applied onto the overcoat layer 110 so as to form a flat upper surface, since the bank constituent material that has entered the concave area 110a is thicker than the bank constituent material on the overcoat layer 110, which is relatively flat, light may not be uniformly transmitted to the bank material within the concave area 110a due to the difference in exposure amount during an exposure process of defining the bank 112. Accordingly, when the bank material that corresponds to the concave area 110a undergoes diffraction and is then subjected to an exposure and developing process, due to the difference in the amount of transmission of light between the upper surface of the bank constituent material and the lower surface of the bank constituent material within the concave area 110a, the bank 112 is defined in such a shape that a portion of the bank 112 that corresponds to the concave area 110 is inversely tapered and a portion of the bank 112 that is provided on the flat overcoat layer 110 and the first electrode 111 is positively tapered, as illustrated in FIG. 2.

In this instance, the concave area 110a is provided in a portion of the non-emission portion, and overlaps the bank 112 to allow the bank 112 to have an inversely tapered shape.

In addition, in order to effectively attain the inversely tapered shape, the bank 112 may be formed of a light-shielding organic material such as a black resin. In this instance, in the exposure process of defining the shape of the bank 112, a portion of the bank material that is located within the concave area 110a transmits almost no exposure light due to the low transmittance of the light-shielding material. This ensures easier realization of the inversely tapered shape due to the difference in the amount of light between the upper surface of the bank material and the lower surface of the bank material within the concave area 110a.

Meanwhile, in the organic light-emitting array of the present invention, the reason why the bank 112 does not have a symmetrical shape in the non-emission portion, but has a shape in which one side thereof close to the emission portion is positively tapered and the other side thereof distant from the emission portion is inversely tapered, is to allow the organic layer 113, which is provided between the first electrode 111 and the second electrode 114, to be separated and disconnected between neighboring sub-pixels, using the difference in shape between opposite sides of the bank 112 without using a separate deposition mask.

In this instance, the organic layer 113 may be located only in a region of the concave area 110a formed in the overcoat layer 110 that does not overlap the bank 112.

As described above, when a tandem-type organic light-emitting element, in which an organic layer between a first electrode and a second electrode is not separated, but is provided in common in sub-pixels, is provided, although no deposition mask is required in order to match the number of organic layers, an organic light-emitting array having such a general tandem-type organic light-emitting element may cause unintentional horizontal current leakage due to the organic layer of neighboring sub-pixels, in addition to intentional vertical current flow between first and second electrodes, since the organic layer is present over all sub-pixels.

The organic light-emitting array of the present invention realizes separation of the organic layer 113 on the inversely tapered portion of the bank 112 that overlaps the concave area 110a in the process of depositing the organic layer 113 owing to the asymmetrical structure of the bank 112 without changing the structure of a deposition mask, thereby preventing horizontal current leakage by disconnecting the organic layer 113 between the sub-pixels. Here, separation of the organic layer 113 on the inversely tapered portion of the bank 112 is realized since, in the process of depositing an organic material via evaporation, the supplied evaporated organic material having good straightness is uniformly deposited on the positively tapered portion, the flat portion of the bank 112, or the first electrode 111, but does not reach the inversely tapered portion of the bank 112 inside the concave area, and thus the organic layer 113 is not applied to the inversely tapered portion of the bank 112.

Thereby, the organic layer 113 is distinguishable for respective sub-pixels, which may prevent current from horizontally flowing to neighboring sub-pixels through the organic layer, thereby preventing lateral current leakage. In addition, through distinction of the organic layer 113 for each sub-pixel, a particular sub-pixel may be independently operated, which may prevent color mixing between sub-pixels.

Meanwhile, the organic light-emitting element, which includes the first and second electrodes 111 and 114 and the organic layer 113 between the first and second electrodes 111 and 114, may be a single white organic light-emitting element. In this instance, the organic layer 113 may include an organic emission layer, a hole transport layer disposed under the organic emission layer, which is a first common layer COM1, and an electron transport layer disposed above the organic emission layer, which is a second common layer COM2, and may further include a hole injection layer between the first electrode 111 and the first common layer COM1. In addition, the first common layer COM1 and/or the second common layer COM2 may be formed into a plurality of layers.

When the organic light-emitting element, which includes the first and second electrodes 111 and 114 and the organic layer 113 between the first and second electrodes 111 and 114, is a tandem-type element having a plurality of stacks, the organic layer 113 may include at least a first stack and a second stack, and each stack may include the organic emission layer (EML), the first common layer COM1 under the organic emission layer, and the second common layer COM2 above the organic emission layer. In addition, the organic emission layers provided in the respective stacks may be different colors of emission layers that emit different colors of light.

For example, the first stack may include a blue emission layer B EML and the second stack may include a yellow-green emission layer YG EML. However, the present invention is not limited thereto, and in the instance of a tandem-type organic light-emitting element, combinations of different colors of emission layers may be included in several stacks in order to realize white light.

When the organic light-emitting array of the present invention includes such a tandem-type organic light-emitting element, in the process of forming the organic layer 113, even if a deposition mask is used to commonly deposit the organic layer 113 over the entire array area without distinction of sub-pixels, the organic layer 113 deposited between sub-pixels may be naturally separated due to the asymmetrical shape of the bank 112, which may prevent current from laterally leaking between neighboring sub-pixels, and consequently preventing color mixing between the neighboring sub-pixels.

Meanwhile, in the organic light-emitting array of the present invention, an example in which the concave area 110a is defined in the overcoat layer 110 on the substrate 100 has been described. In this instance, the substrate 100 is formed of a material, which has a thickness of 10 μm or more, like a plastic such as, for example, polyimide or photo acryl, or glass, and is used as an array forming surface.

However, the concave area 110a is not limited to the example in which the concave area is provided in the surface of the overcoat layer 110 on the substrate 100 as described above, and may alternatively be directly formed in the surface of the substrate 100 when the substrate 100 is formed of an organic material such as a plastic film.

Hereinafter, various shapes of the bank according to the present invention will be described with reference to cross-sectional views thereof.

Figure 3:
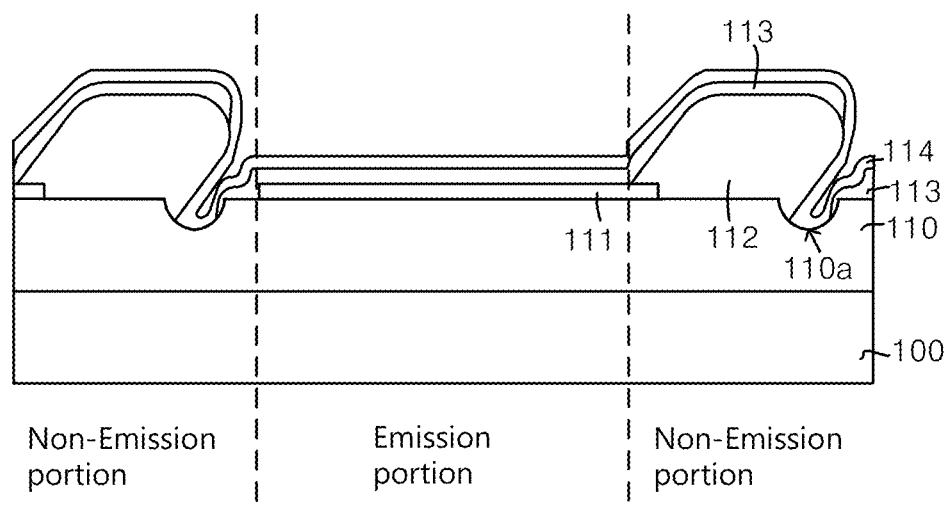
FIG. 3 is a cross-sectional view illustrating an organic light-emitting array according to a second embodiment of the present invention.

FIG. 3 is a cross-sectional view illustrating an organic light-emitting array according to a second embodiment of the present invention.

As illustrated in FIG. 3, the organic light-emitting array according to the second embodiment of the present invention illustrates an example in which the concave area 110a is reduced in width and is deviated to one side of the non-emission portion, compared to the first embodiment. Here, one end of the concave area 110a may be located on the boundary of the emission portion and the non-emission portion.

Here, the bank 112 is positively tapered in a portion thereof that overlaps the edge of the first electrode 111, has a flat top in a portion thereof that is provided on the flat overcoat layer 110 in the non-emission portion, and is inversely tapered in a portion thereof that overlaps the concave area 110a. The end of the inversely tapered portion of the bank 112 is in contact with the neighboring emission portion.

That is, since one end of the concave area 110a is in contact with the boundary of the emission portion and the non-emission portion, the farthest protruding position of the inversely tapered portion of the bank 112 may come into contact with the boundary of the emission portion and the non-emission portion. In this instance, the organic layer 113 formed on the bank 112 is separated from one end of each sub-pixel.

In addition, in the second embodiment, the inversely tapered portion of the bank 112 may be located only in one side of the concave area 110a and may be formed so as to protrude an amount corresponding to the width of the concave area 110a.

In this second embodiment, the concave area 110a may be located in one side of the non-emission portion, a flat portion of the overcoat layer 110 may be located between the first electrode 111 and the concave area 110a, and the bank 112 may have a portion having a flat top, which is provided between the positively tapered portion and the inversely tapered portion thereof along the flat portion of the overcoat layer 110.

In the organic light-emitting arrays of the first embodiment and the second embodiment described above, the bank 112 provided in each sub-pixel causes the organic layer 113 to be separated on the inversely tapered portion thereof. To this end, the inversely tapered portion may correspond to the entire edge or a portion of the edge of the first electrode 111 when viewed in plan.

When the bank 112 is formed on a portion of the edge of the first electrode 111, the edge portion of the first electrode 111 that does not overlap the bank 112 may be the boundary of the emission portion and the non-emission portion. In this instance, in the first and second embodiments, the inversely tapered portion of the bank 112 may be located only in one side of the concave area 110a, and may not be provided in the other side of the concave area 110a. In addition, the organic layer 113 may be provided in the other side of the concave area 110a, on which no bank 112 is provided.

Figure 4:
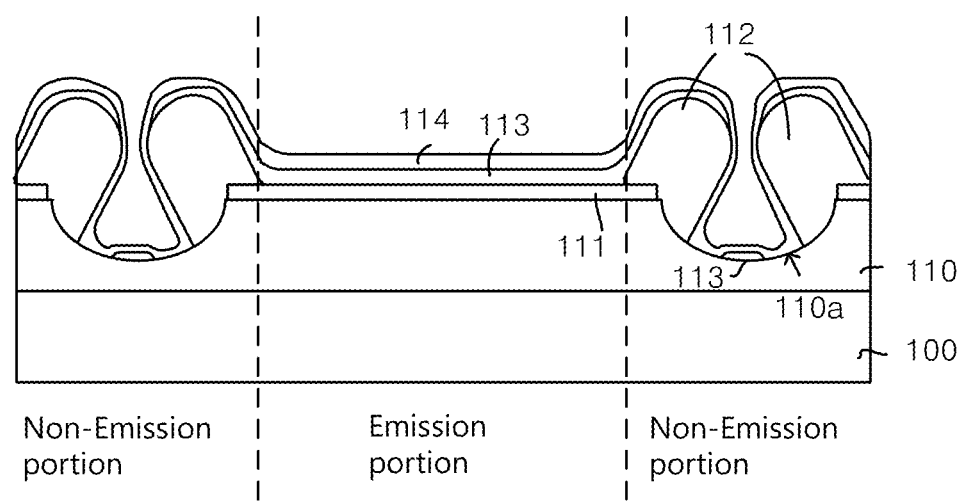
FIG. 4 is a cross-sectional view illustrating an organic light-emitting array according to a third embodiment of the present invention.

FIG. 4 is a cross-sectional view illustrating an organic light-emitting array according to a third embodiment of the present invention.

As illustrated in FIG. 4, the organic light-emitting array according to the third embodiment of the present invention illustrates an example in which a plurality of banks 112, each having an asymmetrical shape, is arranged so as to surround the edge of the first electrode 111. In this instance, the inversely tapered portion of the bank 112 is located around the emission portion so as not to overlap the first electrode 111. As such, since the organic layer 113 is discontinuous on the farthest protruding position of the inversely tapered portion, the organic layer 113 is separated between neighboring sub-pixels. A gap is located between adjacent banks 112.

Figure 5:
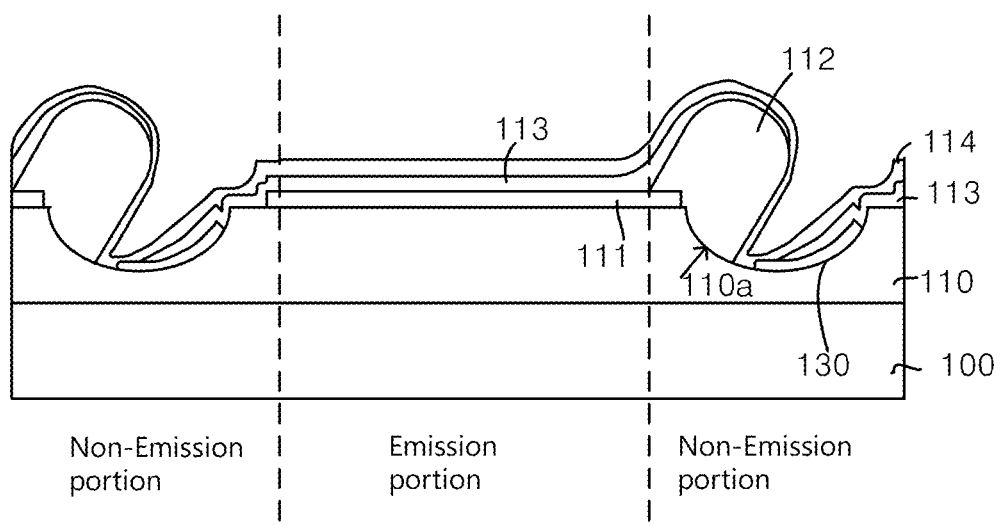
FIG. 5 is a cross-sectional view illustrating an organic light-emitting array according to a fourth embodiment of the present invention.

FIG. 5 is a cross-sectional view illustrating an organic light-emitting array according to a fourth embodiment of the present invention.

As illustrated in FIG. 5, the organic light-emitting array according to the fourth embodiment of the present invention is configured to separate the organic layer 113 between neighboring sub-pixels and to reduce the resistance of the second electrode 114. To this end, an auxiliary wire 130 is electrically connected to the second electrode 114, which is integrally formed throughout the array including a plurality of sub-pixels, and the auxiliary wire 130 is provided in the same layer as the first electrode 111. In this instance, the auxiliary wire 130 is provided in a portion of the non-emission portion and is formed in the concave area 110a so as to be located inside the inversely tapered portion of the bank 112 while being electrically separated from the first electrode 111. In this instance, even if evaporated organic material is deposited in the concave area 110a, no organic material is deposited on the region in which the inversely tapered portion of the bank 112 is located, which prevents the auxiliary wire 130 that overlaps the inversely tapered portion from overlapping the organic material.

In addition, after the organic layer 113 is formed on the bank 112 via the deposition of the organic material, in the process of forming the second electrode 114, metal particles are randomly distributed and deposited via metal sputtering so that the second electrode 114 is also formed on the top of the auxiliary wire 130, which overlaps the inversely tapered portion of the bank 112 within the concave area 110a, whereby electrical connection between the auxiliary wire 130 and the second electrode 114 is realized.

In this instance, each of the auxiliary wire 130 and the first electrode 111 may be a stack of a reflective metal having high conductivity such as, for example, Ag, and a transparent electrode such as, for example, indium tin oxide (ITO). The reflective metal may be located only under the transparent electrode, or may be located both above and under the transparent electrode.

In addition, the second electrode 114, which is connected to the auxiliary wire 130, may be formed on both the positively tapered portion and the inversely tapered portion of the bank 112 because of excellent deposition coverage during the metal sputtering process, and may also be formed on the auxiliary wire 130 within the concave area 110a that overlaps the inversely tapered portion, thereby being integrally formed throughout the array area including the plural sub-pixels. In this way, the second electrode 114 may be connected to the auxiliary wire 130, which is provided for respective sub-pixels, and may be reduced in resistance on the entire substrate 100, resulting in reduced unevenness of panel brightness.

In addition, the organic light-emitting arrays according to the above-described embodiments of the present invention realize separation of the organic layer in a region between neighboring sub-pixels via the asymmetric structure of the positively tapered portion of the bank 112 that overlaps the first electrode 111 and the inversely tapered portion of the bank 112. Since pixelation is possible based on only the shape of the bank 112 without using a deposition mask, which distinguishes the organic layer 113 for each sub-pixel, the desirable advantages of the tandem structure and remarkable lateral current leakage prevention may be achieved.

Figure 6:
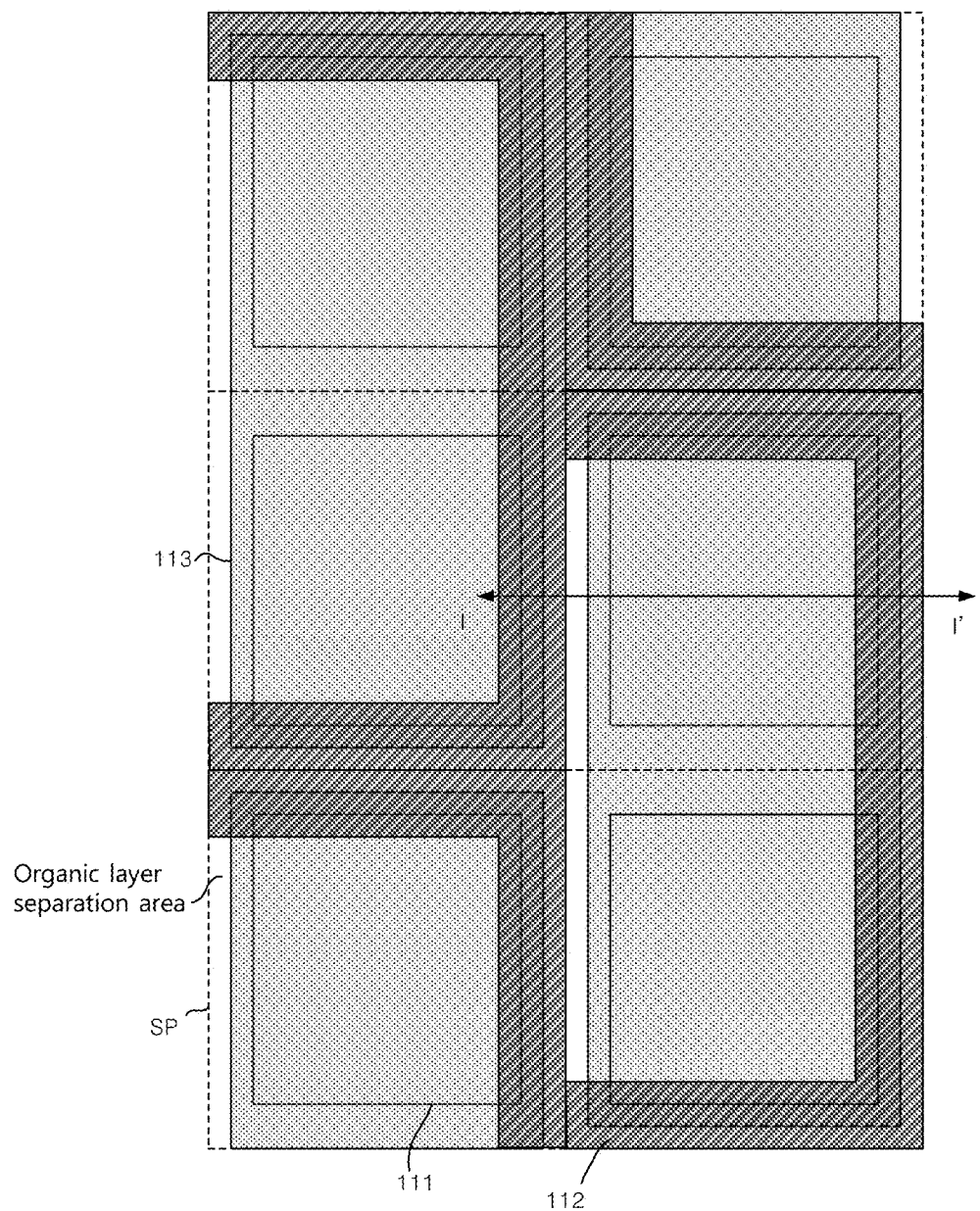
FIG. 6 is a plan view illustrating the organic light-emitting array according to an embodiment of the present invention.

FIG. 6 is a plan view illustrating the organic light-emitting array according to an embodiment of the present invention.

The line I-I' of FIG. 6 may correspond to the display area of FIGS. 2 and 3 or FIG. 5 described above.

As illustrated in FIG. 6, in the light-emitting array according to the embodiment of the present invention, an organic layer separation area may have an "I"-shaped form around the emission portion in each sub-pixel. Here, when the "I"-shaped area is repeated for every sub-pixel, the organic layer separation areas may be arranged so as to extend in the direction of some columns throughout the array including all of the sub-pixels.

Referring to FIG. 6, the emission portion represents a portion of the first electrode 111 that is not covered with the bank 112. In this instance, since the bank 112 is located to correspond to two sides of a " ⌐ "-shaped or " ∟ "-shaped portion that is close to the first electrode 111, the emission portion is smaller than the first electrode 111.

In addition, in an example in which the organic layer separation area is illustrated as the portion in which no bank 112 is located or in which the inversely tapered portion of the bank 112 is located, although the organic layer separation area is located in an "I"-shaped form so as to correspond to one side of each sub-pixel SP, the present invention is not limited thereto. This example of the organic layer separation area will be described below.

The organic layer is divided on the basis of the organic layer separation area illustrated in a plan view, and lateral current leakage may be prevented via the separation of the organic layer between neighboring sub-pixels.

In addition, FIG. 6 illustrates the organic layer separation area as being located in a portion of the non-emission portion. The organic layer is evenly deposited throughout the emission portion and on a portion of the non-emission portion in which no organic layer separation area is defined.

Hereinafter, various shapes of the organic layer separation area will be described.

FIGS. 7A to 7E are plan views illustrating the organic layer separation area of the organic light-emitting array according to various embodiments of the present invention.

Figure 7A:
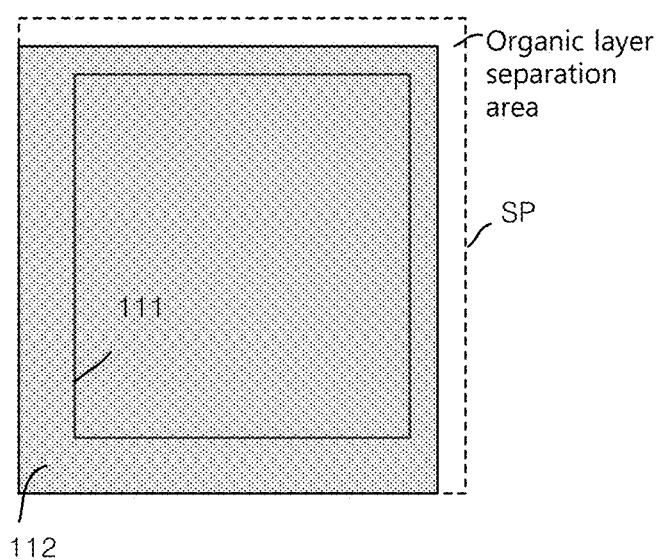
FIGS. 7A to 7E are plan views illustrating an organic layer separation area of the organic light-emitting array according to various embodiments of the present invention.

As illustrated in FIG. 7A, the organic layer separation area may have a " ⌐"-shaped form in one sub-pixel, but may have a "L"-shaped form, which is a left-and-right inverted shape of the " ⌐"-shaped form, in a neighboring sub-pixel, so as to have different shapes in neighboring sub-pixels SP.

Figure 7B:
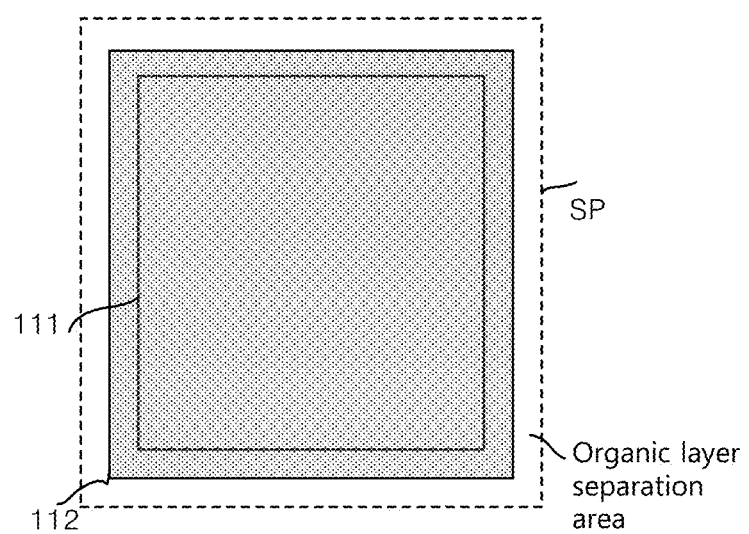

In addition, as illustrated in FIG. 7B, the organic layer separation area may be provided so as to surround four sides of the sub-pixel SP.

Figure 7C:
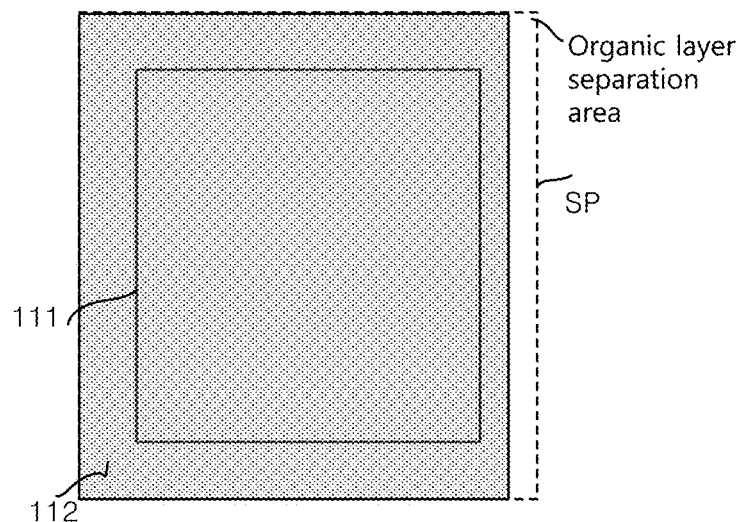
Figure 7D:
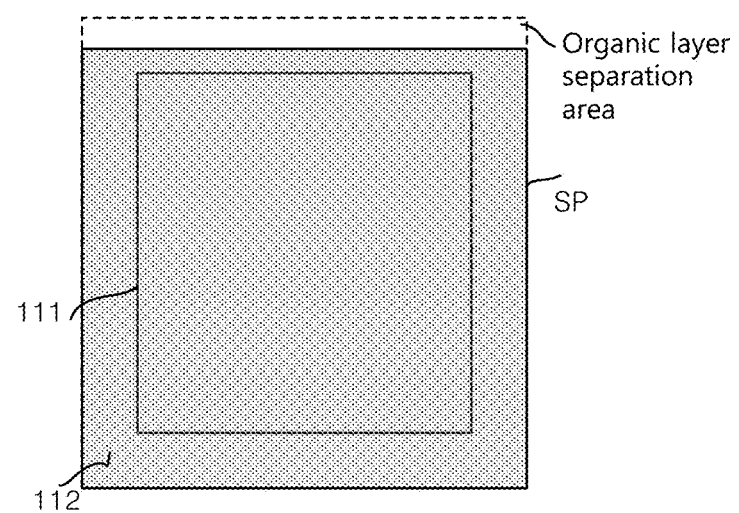
Figure 7E:
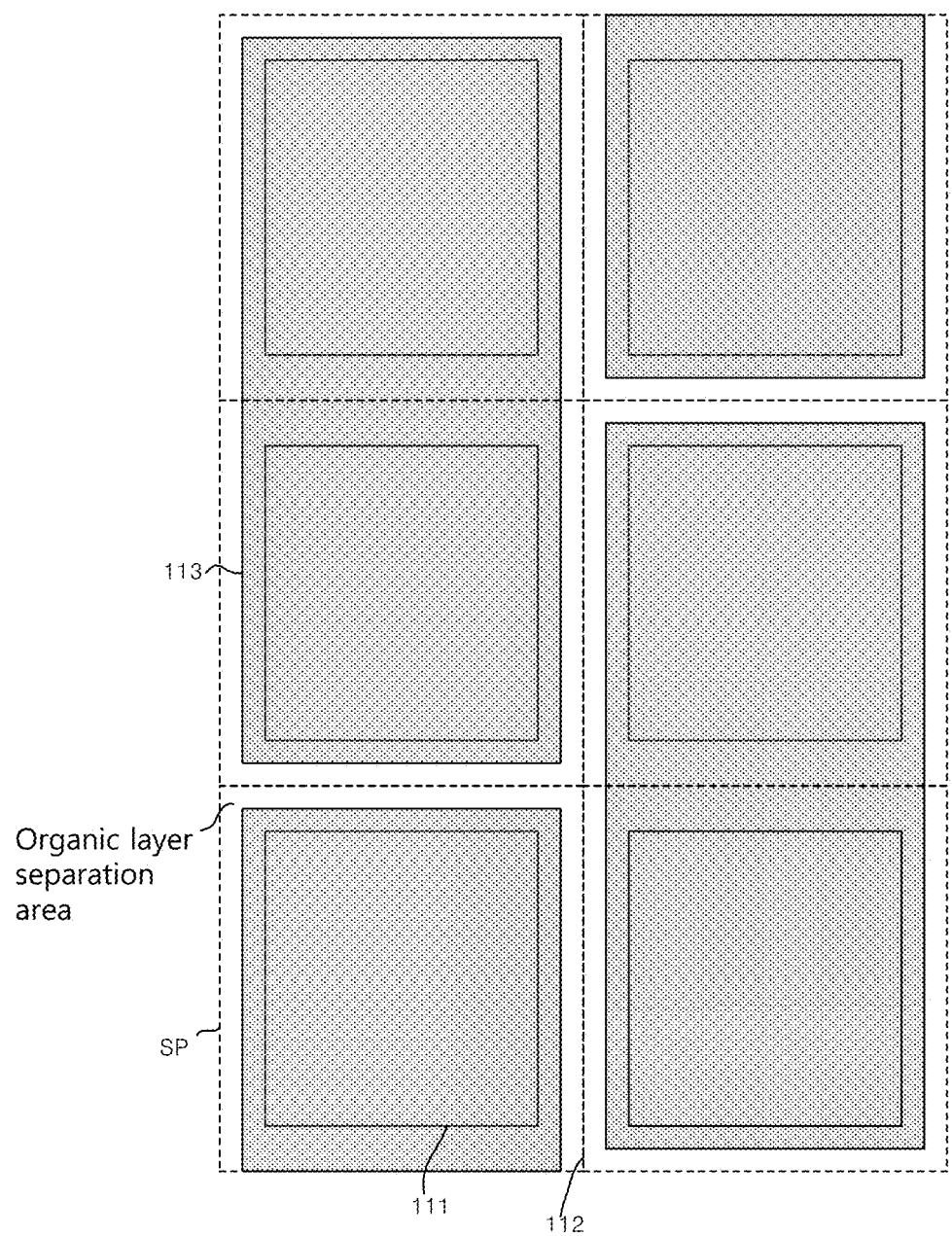

In addition, the organic layer separation area may have the "I"-shaped form illustrated in FIG. 7C, or may have the "-"-shaped form illustrated in FIG. 7D, for each sub-pixel SP. Alternatively, the organic layer separation area may have the "⊏"-shaped form illustrated in FIG. 7E for neighboring sub-pixels.

In some instances, the organic layer separation area may be disposed for two or more sub-pixels. In this instance, the organic layer may be continuously formed for sub-pixels, which have the most similar color. Neighboring sub-pixels having different colors may have the organic layer separation area in order to prevent color mixing.

Meanwhile, the organic layer separation area described with regard to the organic light-emitting array of the present invention has the effect of dividing the organic layer into an upper layer and a lower layer at the position of the inversely tapered portion of the bank 112 when viewed in a cross section. Accordingly, a portion of the organic layer 113 may remain in the organic layer separation area. However, in the organic layer separation area, no first electrode is provided under the remaining organic layer 113, and no light is emitted.

The organic layer separation area of the present invention described above is not defined using a separate deposition mask, but is provided based on a phenomenon whereby the organic layer 113 is discontinuous, rather than being continuously deposited, on the farthest protruding position of the inversely tapered portion of the bank 112.

The organic layer separation area may correspond to the inversely tapered portion of the bank 112.

In addition, no bank may be provided in a portion of the organic layer separation area. Since no first electrode is located under the organic layer separation area, no emission is implemented in the organic layer separation area.

Hereinafter, a method of manufacturing the organic light-emitting array of the present invention will be described with reference to the drawings.

Figure 8A:
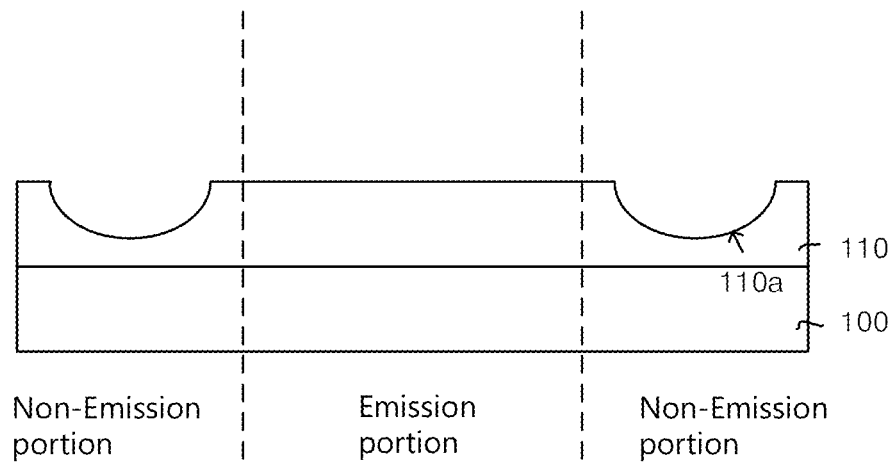
FIGS. 8A to 8E are cross-sectional views illustrating a method of manufacturing the organic light-emitting array according to the present invention.
Figure 8B:
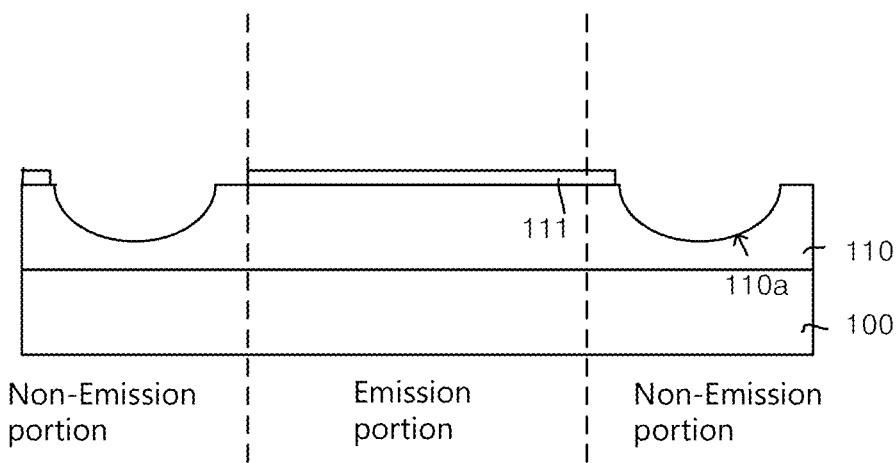
Figure 8C:
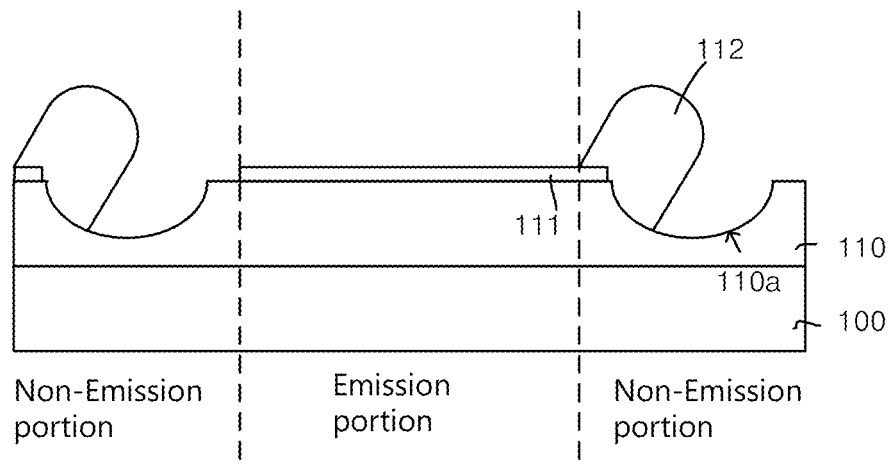
Figure 8D:
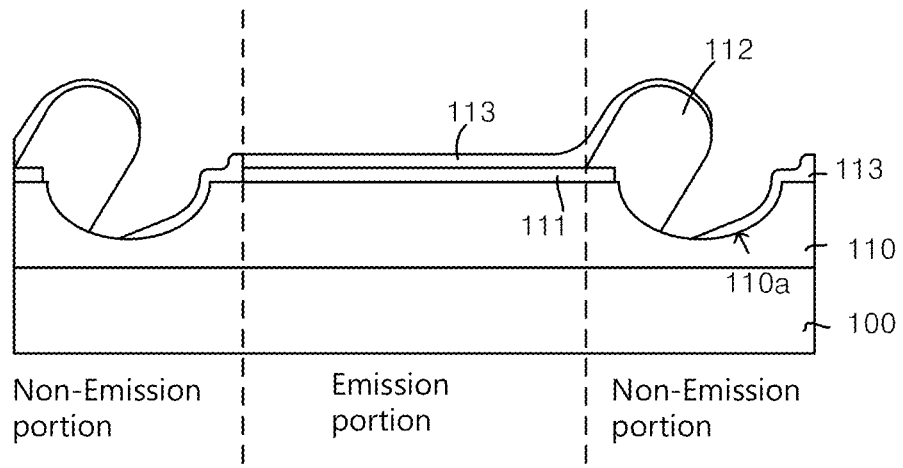
Figure 8E:
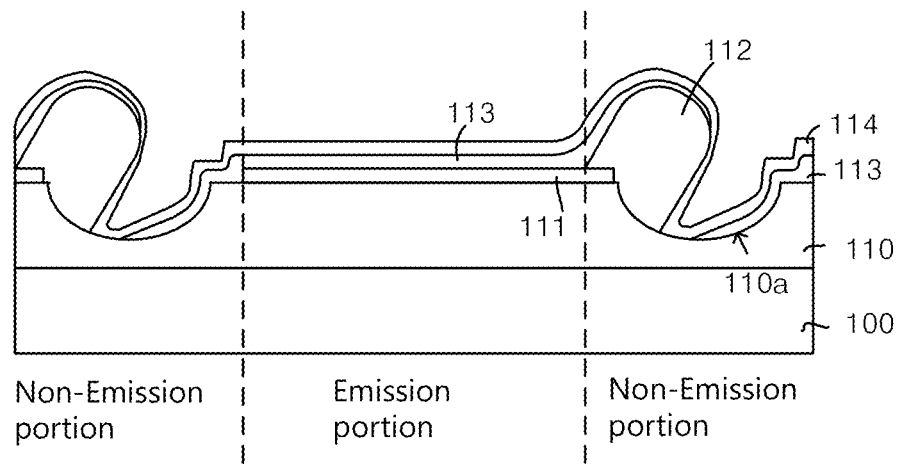
Figure 9:
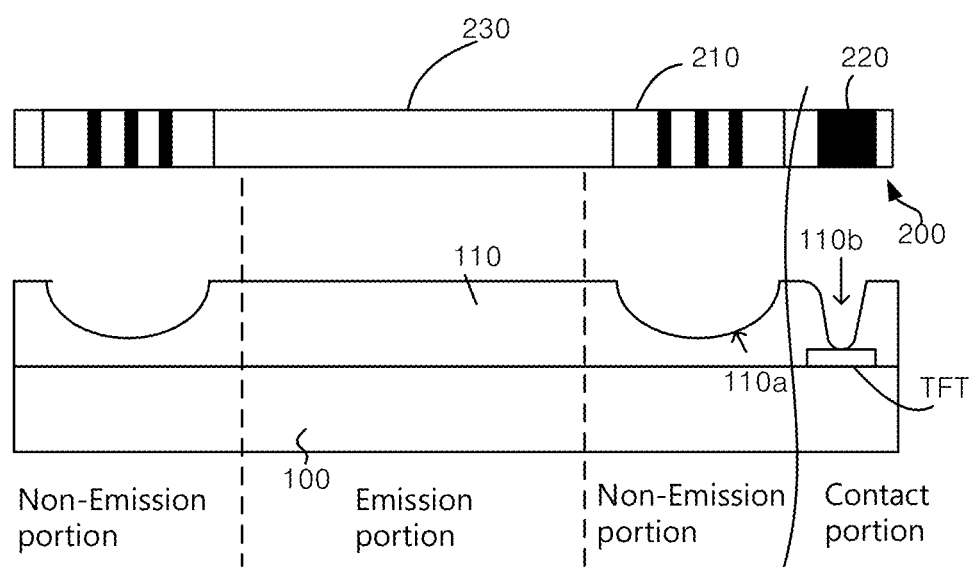
FIG. 9 is a cross-sectional view illustrating the process of forming a concave area in the organic light-emitting array according to the present invention.

FIGS. 8A to 8E are cross-sectional views illustrating the method of manufacturing the organic light-emitting array according to the present invention, and FIG. 9 is a cross-sectional view illustrating the process of forming the organic layer separation area of the organic light-emitting array according to the present invention.

First, as illustrated in FIG. 8A, the overcoat layer 110 having the concave area 110a, a portion of the upper surface of which is gently removed in the thickness direction, is formed on the substrate 100.

Here, for example, assuming that the overcoat layer 110 is formed of a negative photosensitive material, after the negative photosensitive material is applied to the entire surface of the substrate 100, as illustrated in FIG. 9, the negative photosensitive material is exposed and developed using a mask 200, which includes a diffraction pattern 210 that corresponds to the portion in which the concave area 110a is defined, an opening 230 that corresponds to a flat portion, and a light-shielding portion 220 that corresponds to a contact hole 110b, which is formed through the entire thickness so as to expose a portion of a thin-film transistor (TFT) for performing contact, whereby the negative photosensitive material remains on the portions that correspond to the opening 230 and the diffraction pattern 210. After the exposure and developing process, the overcoat layer 110 has the concave area 110a that corresponds to the diffraction pattern 210 and also has the contact hole 110b in a contact portion thereof.

The diffraction pattern 210 includes a central light-shielding material that exhibits low resolution and an opening therearound. As diffraction occurs in the opening around the light-shielding material, the diffraction pattern 210 transmits a different amount of light from that of the opening 230 around the diffraction pattern 210 to the negative photosensitive material. Thereby, upon developing after exposure, the surface of the negative photosensitive material, which corresponds to the diffraction pattern 210 and receives diffracted light, forms a gently concave area, unlike the remaining portion of the negative photosensitive material, which corresponds to the opening and remains in the entire thickness.

After developing, the negative photosensitive material may maintain the shape thereof via firing. Then, the portion of the overcoat layer, the entire thickness of which has been removed simultaneously with the exposure and developing process, may function as the contact hole 110b that exposes a portion of the thin-film transistor.

Subsequently, as illustrated in FIG. 8B, the first electrode 111 is formed on the overcoat layer 110 so as to fill the entire emission portion and a portion of the non-emission portion. At this time, the first electrode 111 is configured so as not to overlap the concave area 110a.

Subsequently, as illustrated in FIG. 8C, the bank 112 is formed by applying a black resin and exposing and developing the same so as to allow the same to remain in the non-emission portion. At this time, the bank 112 has a positively tapered portion that overlaps the first electrode 111 and also has an inversely tapered portion that overlaps the concave area 110a. This is because the black resin introduced into the concave area 110a is patterned to a relatively low height along the concave area 110a when receiving a small amount of exposure light, whereby the bank 112 attains the inversely tapered portion that overlaps the concave area 110a.

Subsequently, as illustrated in FIG. 8D, the organic layer 113 including an organic emission layer is deposited on the first electrode 111 and the bank 112.

At this time, since an organic material exhibits excellent straightness upon evaporation deposition, the organic layer 113 is deposited on the flat first electrode 111 and the protruding portion of the bank 112. However, since the organic material does not reach the inversely tapered portion of the bank 112, the organic layer 113 on the bank 112 is separated from the organic layer 113 that has entered the concave area 110a, which does not overlap the bank 112.

Subsequently, as illustrated in FIG. 8E, the second electrode 114 is formed on the organic layer 113, which is separated between neighboring sub-pixels.

In this instance, the second electrode 114 is formed via metal deposition such as sputtering. As such, metal particles, which are randomly supplied, are also transferred to the inversely tapered portion of the bank 112, whereby the second electrode 114 may be formed inside the inversely tapered portion of the bank 112 within the concave area 110a. Accordingly, the second electrodes 114 of neighboring sub-pixels may be connected to each other and may be integrally formed.

That is, it can be appreciated that the organic light-emitting array of the present invention described above realizes separation of the organic layer 113 between neighboring sub-pixels using the shape of the bank 112.

Hereinafter, an organic light-emitting display device using the organic light-emitting array of the present invention will be described.

Figure 10:
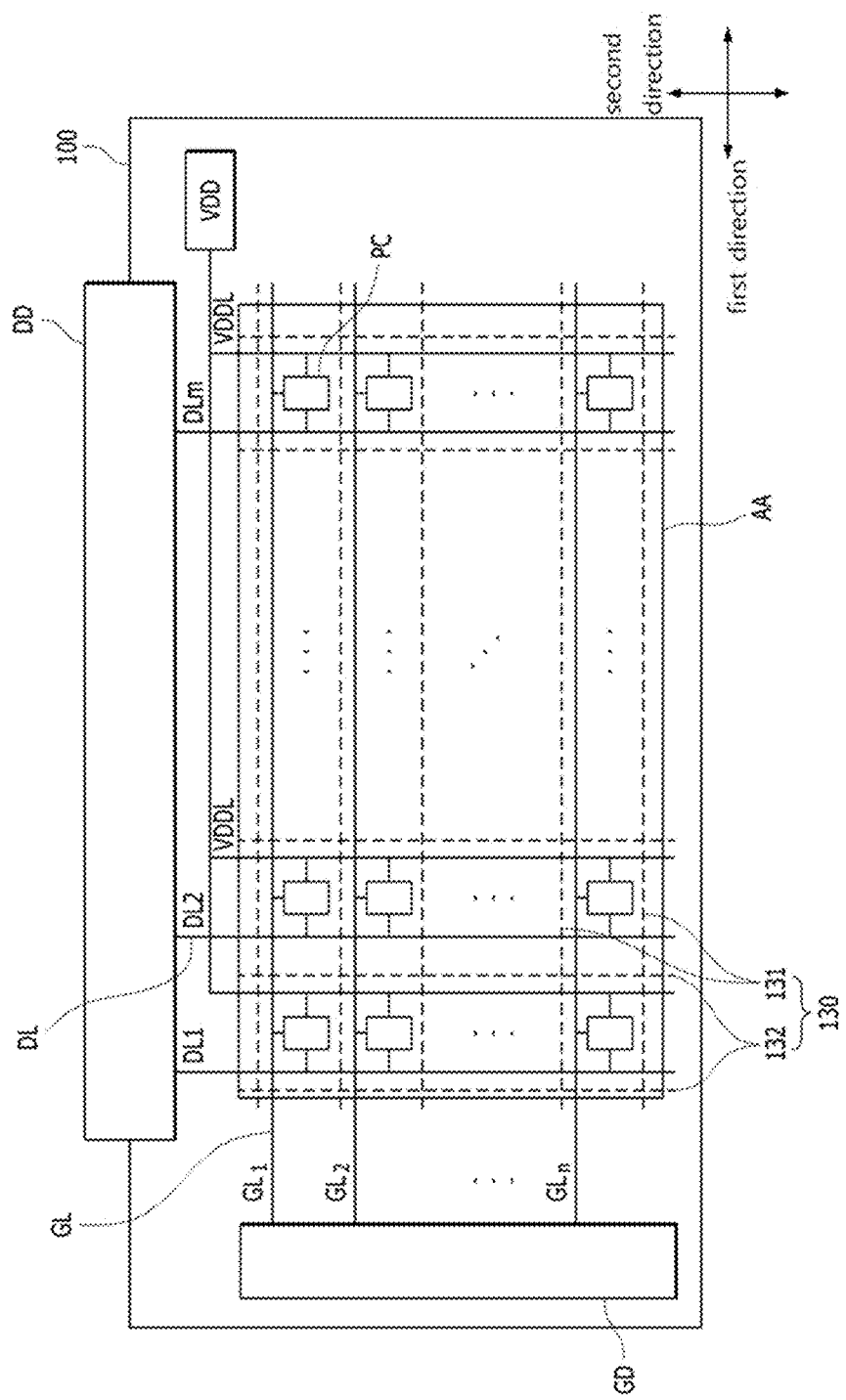
FIG. 10 is a view illustrating an organic light-emitting display device according to the present invention.
Figure 11:
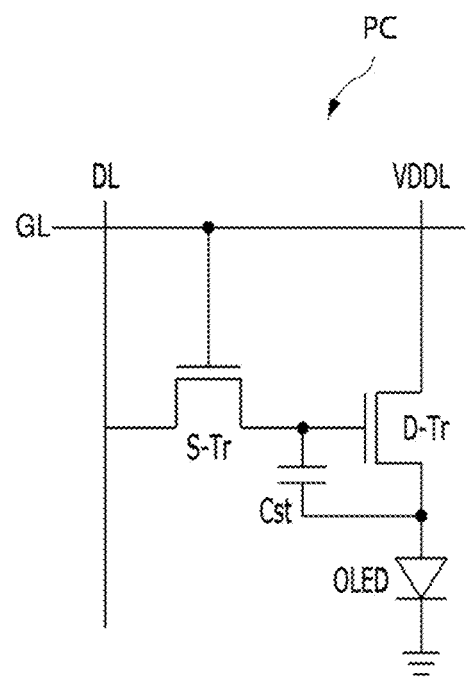
FIG. 11 is a circuit diagram of each sub-pixel of FIG. 10.

FIG. 10 is a view illustrating an organic light-emitting display device according to the present invention, and FIG. 11 is a circuit diagram of each sub-pixel of FIG. 10.

As illustrated in FIG. 10, the organic light-emitting display device of the present invention includes the substrate 100 having a polygonal shape, preferably, a rectangular shape, and also includes constituent elements on the substrate 100.

In addition, the substrate 100 is broadly divided into a center display area AA and a peripheral non-display area. In the display area AA, sub-pixels SP, each having an emission portion EA and a non-emission portion NEA, are arranged in a matrix form. The organic light-emitting array described above is located in the display area AA.

The sub-pixels SP are divided by gate lines GL and data lines DL, which cross each other. In addition, in the display area AA, a driving voltage line VDDL, to which a driving voltage is applied, is further provided in the same direction as the data lines DL so as to drive a pixel circuit PC provided in each sub-pixel SP. The driving voltage line VDDL is connected to a driving thin-film transistor D-Tr, which constitutes the pixel circuit PC.

Considering the pixel circuit PC connected to the aforementioned lines with reference to FIG. 11, the pixel circuit PC includes a switching thin-film transistor Sw-Tr provided at the intersection of the gate line GL and the data line DL, the driving thin-film transistor D-Tr provided between the switching thin-film transistor S-Tr and the driving voltage line VDDL, an organic light-emitting diode OLED connected to the driving thin-film transistor D-Tr, and a storage capacitor $C_{st}$ provided between a gate electrode and a drain electrode (or a source electrode) of the driving thin-film transistor D-Tr.

Here, the switching thin-film transistor Sw-Tr is formed in the region at which the gate line GL and the data line DL cross each other, and functions to select a corresponding sub-pixel. In addition, the driving thin-film transistor D-Tr functions to drive the organic light-emitting diode OLED of the sub-pixel selected by the switching thin-film transistor Sw-Tr.

In addition, the non-display peripheral area includes a gate driver GD, which supplies a scan signal to the gate line GL, and a data driver DD, which supplies a data signal to the data line DL. In addition, the driving voltage line VDDL may include a first power supply VDD in the peripheral area so as to receive a driving voltage, or may receive a driving voltage via the data driver DD.

Here, the gate driver GD, the data driver DD and the first power supply VDD may be mounted in the peripheral area of the substrate 100 when the thin-film transistors are formed in the display area AA, or may be formed by attaching a separate film or a printed circuit board to the peripheral area of the substrate 100. These circuit drivers are provided in the peripheral area in any case, and to this end, the display area AA is defined inside the edge of the substrate 100.

In addition, the gate driver GD sequentially supplies scan signals to the plurality of gate lines GL. For example, the gate driver GD is a control circuit and supplies scan signals to the plural gate lines GL in response to a control signal supplied from, for example, a timing controller.

In addition, the data driver DD supplies data signals to data lines DL1 to DLm selected from among the data lines DL in response to a control signal supplied from, for example, the timing controller. The data signals supplied to the data lines DL1 to DLm are supplied to the selected sub-pixels SP by the scan signals whenever the scan signals are supplied to the gate lines GL to GLn. In this way, the sub-pixels SP are charged with a voltage that corresponds to the data signals, and emit light at a corresponding brightness.

Meanwhile, the substrate 100 may be an insulation substrate formed of, for example, plastic, glass or ceramic. When the substrate 100 is formed of a plastic, it may be slim and flexible so as to be bendable. However, the substrate 100 is not limited thereto, and may be formed of a metal and may further include an insulation buffer layer on the side thereof on which a wire is formed.

In addition, multiple sub-pixels SP, for example, three or four sub-pixels, which emit different colors of light, may constitute a set so as to define each pixel.

Such a sub-pixel SP may include a particular type of color filter formed thereon, or an organic light-emitting diode may emit a particular color of light without a color filter. Although colors defined by the sub-pixels SP may include red R, green G and blue B and may also selectively include white W, the present invention is not limited thereto.

The organic light-emitting diode OLED is connected to the driving thin-film transistor D-Tr at a first node A, and includes a first electrode provided for each sub-pixel, a second electrode opposite the first electrode, and an organic emission layer between the first and second electrodes.

Meanwhile, the organic light-emitting display device may be of a top-emission type, a bottom-emission type or a dual-emission type. Here, regardless of which emission-type is selected, in a large-area display panel, a voltage drop across the second electrode may occur in the process of forming the second electrode of the organic light-emitting diode that has high resistance on the entire surface of the display area. Therefore, in the present invention, to solve this problem, an auxiliary electrode or the auxiliary wire 130 may be provided in the non-emission portion, as illustrated in FIG. 10.

Here, the auxiliary wire 130 may be a metal in the same layer as the first electrode 111, and may have a contact CA with respect to the second electrode so that the second electrode and the auxiliary wire 130 having good conductivity are connected to each other for each sub-pixel or each pixel, which may reduce the resistance of the second electrode in the direction in which the auxiliary wire 130 extends, and consequently may prevent a voltage drop across the second electrode, which becomes gradually worse from the edge to the center.

In the illustrated example, the auxiliary wire 130 may include a first wire 131 in the direction of the gate line GL and a second wire 132 in the direction of the data line DL, without being limited thereto, and may be disposed in only one of these directions.

Meanwhile, the auxiliary line 130 may be formed into a single layer of ITO, Cu, Mo, Al, Ag or Ti, or in multiple layers of combinations thereof, along with the first electrode 111, and may be connected to the second electrode at a second node, thereby functioning to reduce the resistance of the second electrode.

Hereinafter, although embodiments that will be described below are based on a top-emission-type organic light-emitting display device, the embodiments of the present invention are not limited to the top-emission-type, and may be applied to the structures of all display devices that prevent a voltage drop across the second electrode.

In all of the following embodiments, the organic light-emitting display device includes the substrate 100, which includes the display area AA in which the sub-pixels SP, each including the emission portion and the non-emission portion, are arranged in a matrix form, and the peripheral area, which surrounds the display area AA, the driving thin-film transistor D-Tr provided in each sub-pixel SP on the substrate 100, the organic light-emitting diode OLED, which includes the first electrode 111, which is connected to the driving thin-film transistor D-Tr at the first node A and covers the emission portion EA, the second electrode 114 located throughout the display area AA, and the organic layer 113 as an interlayer between the first and second electrodes 111 and 114, the auxiliary wire 130 connected to a lower portion of the second electrode 114 at the second node B, which is located in the non-emission portion NEA, and the overcoat layer 110, which includes the contact hole 110b configured to expose a portion of the driving thin-film transistor D-Tr at a position corresponding to each of the first node A and the second node B and the concave area 110b in which a portion of the surface of the overcoat layer 110 is gently removed in the thickness direction.

Figure 12:
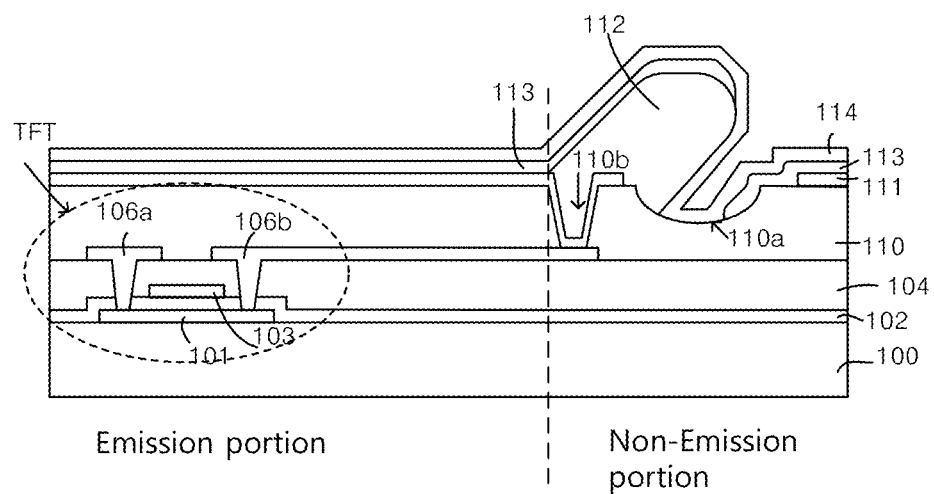
FIG. 12 is a cross-sectional view illustrating the organic light-emitting display device according to the present invention.
Figure 13:
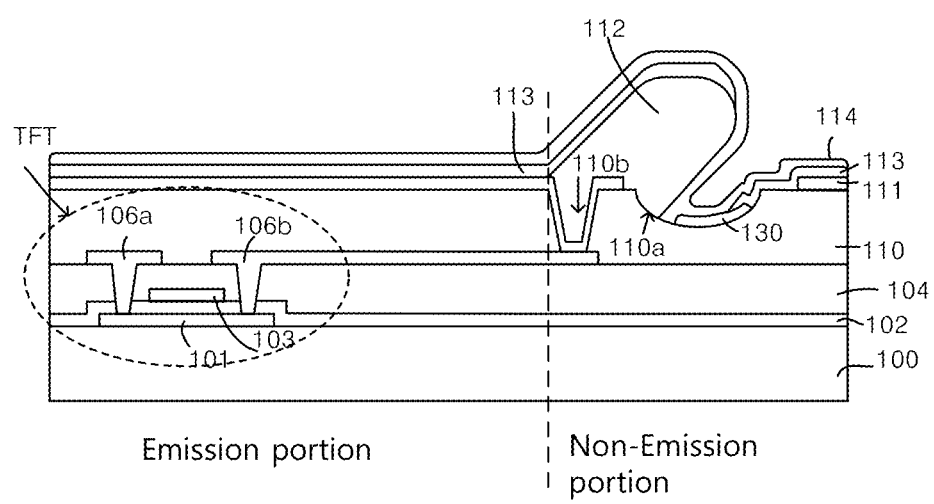
FIG. 13 is a cross-sectional view illustrating an organic light-emitting display device according to another embodiment of the present invention.
Figure 14:
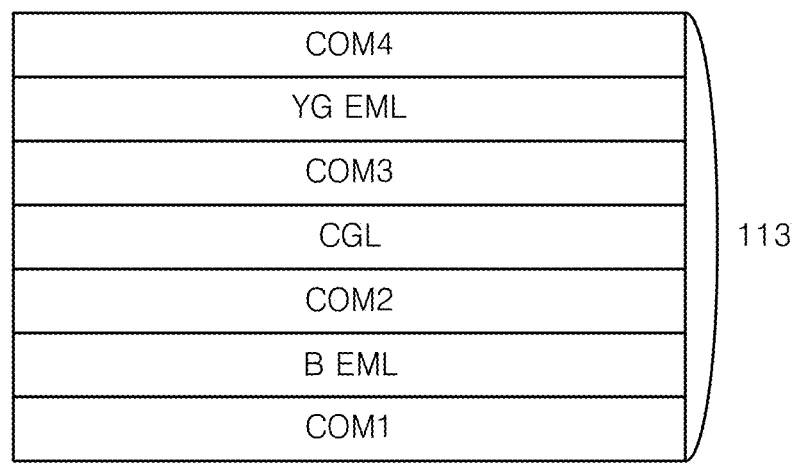
FIG. 14 is a cross-sectional view illustrating an example of a thin organic layer of FIG. 12 or 13.

FIG. 12 is a cross-sectional view illustrating the organic light-emitting display device according to the present invention, FIG. 13 is a cross-sectional view illustrating an organic light-emitting display device according to another embodiment of the present invention, and FIG. 14 is a cross-sectional view illustrating an example of a thin organic layer of FIG. 12 or 13.

The organic light-emitting display device according to the embodiment includes the thin-film transistor TFT in each sub-pixel SP (see FIG. 6), as illustrated in FIGS. 12 and 13.

The thin-film transistor TFT includes an active layer 101 on the substrate 100, a gate electrode 103 formed above a portion of the active layer 101 with a gate insulation layer 102 interposed therebetween so as to be formed on the gate insulation layer 102, and a source electrode 106a and a drain electrode 106b, which are respectively connected to opposite sides of the active layer 101.

Then, the source electrode 106a and the drain electrode 106b are disposed in the same layer, and one side of the drain electrode 106b extends from the emission portion to the non-emission portion.

An interlayer insulation layer 104 is provided on the gate insulation layer 102 excluding connection portions with the source electrode 106a and the drain electrode 106b so as to cover the gate insulation layer 102 and the gate electrode 103.

Then, the overcoat layer 110, which includes the contact hole 110b, which exposes a portion of the drain electrode 106b in the non-emission portion, and the concave area 110a, which is gently recessed in the surface thereof, may be provided on the interlayer insulation layer 104 so as to cover the thin-film transistor.

Then, after the bank 112, which includes a positively tapered portion configured to overlap the first electrode 111 and an inversely tapered portion configured to overlap the concave area 110a, is provided, the organic layer 113 is deposited using the shape of the positively tapered portion and the inversely tapered portion of the bank 112 so as to be separated on the inversely tapered portion. Thereafter, the second electrode 114 is integrally formed over all of the sub-pixels.

Meanwhile, although the organic layer 113 is illustrated as a single layer in the cross-sectional views of FIGS. 12 and 13, the organic layer 113 according to the present embodiment is not limited thereto, and may be formed in multiple layers. For example, as illustrated in FIG. 14, when the organic layer 113 between the first and second electrodes 111 and 114 is formed in a tandem manner, the organic layer 113 may include a first common layer COM1, a blue emission layer B EML, a second common layer COM2, a charge generation layer CGL, a third common layer COM3, a yellow-green emission layer YG EML, and a fourth common layer COM4 in sequence. Although the tandem-type organic layer is deposited throughout the array area without distinction for each sub-pixel, in the organic light-emitting display device of the present invention, the organic layer may be structurally separated on the inversely tapered portion of the bank 112.

Meanwhile, as illustrated in FIG. 13, when the tandem-type organic layer is applied, white light may be emitted. At this time, a color filter may be provided on the second electrode 114 to enable color display.

In some instances, the organic layer 113 may be divided for each sub-pixel, thereby being formed as red, green and blue emission layers, and is not limited upon application of the organic light-emitting array of the present invention.

Meanwhile, the organic light-emitting display device according to another embodiment of FIG. 13 is the same as that illustrated in FIG. 12, excluding that the auxiliary wire 130 is provided in the same layer as the first electrode 111, and the description related to the same configuration will be omitted.

The auxiliary wire 130 needs to be electrically connected to the second electrode 114, and remains electrically separated from the source and drain electrodes 106a and 106b of the thin-film transistor TFT.

Figure 15A:
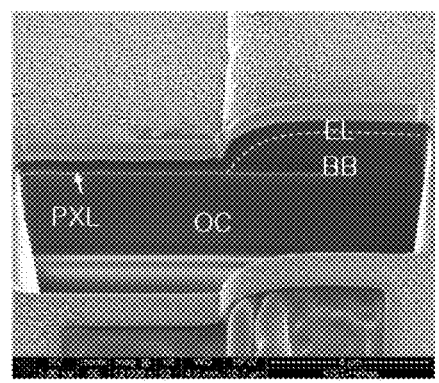
FIGS. 15A and 15B are SEM views respectively corresponding to a positively tapered portion and an inversely tapered portion of a bank when the organic light-emitting array of the present invention is applied.
Figure 15B:
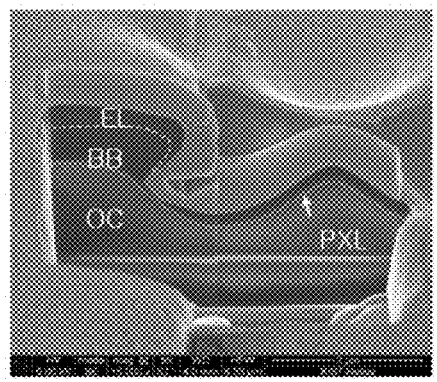

FIGS. 15A and 15B are SEM views respectively corresponding to a positively tapered portion and an inversely tapered portion of a bank when the organic light-emitting array of the present invention is applied.

As illustrated in FIG. 15A, it can be observed that an organic layer EL is normally formed on a positively tapered portion so as to extend along a bank BB and a first electrode PXL.

On the other hand, as illustrated in FIG. 15B, it can be seen that the organic layer EL remains on the flat bank BB, but is discontinuous on an inversely tapered portion, whereby the organic layer EL is separated between neighboring sub-pixels.

As is apparent from the above description, an organic light-emitting array and an organic light-emitting display device using the same according to the present invention have the following effects.

First, a bank, which defines an emission portion of a sub-pixel, has an asymmetrical shape including a positively tapered portion at one side thereof and an inversely tapered portion at the other side thereof when viewed in a cross section so that a thin organic layer is deposited so as to be discontinuous on the inversely tapered portion, which enables separation of the organic layer in a region between neighboring sub-pixels. Thereby, lateral current leakage due to connection of sub-pixels by an organic film may be prevented.

Second, in a tandem-type stack including different organic emission layers, the organic emission layers may be structurally separated for each sub-pixel without using a deposition mask, which may prevent color mixing between different colors of neighboring sub-pixels.

Third, since disconnection of the thin organic layer is made possible by the asymmetrical shape of the bank, current concentration on the edge of each sub-pixel may be prevented, which may prevent deterioration in the lifespan thereof.

Fourth, an auxiliary wire is disposed in the same layer as a first electrode and is connected to a second electrode so as to reduce the resistance of a second electrode, which may prevent variation in brightness for each panel area.

The features, structures, effects and the like described in the above embodiments are included in at least one embodiment of the present invention, and are not necessarily limited to only one embodiment. In addition, the features, structures, effects and the like described in each embodiment may be combined or modified with respect to other embodiments by those skilled in the art. Accordingly, contents related to these combinations and modifications should be construed as being included in the scope of the present invention.

Although the embodiments of the present invention have been described above in detail with reference to the accompanying drawings, it will be apparent to those skilled in the art that various substitutions, modifications, and alterations may be devised within the spirit and scope of the present invention. For example, respective constituent elements, which are concretely described in the embodiments, may be altered in various ways.

What is claimed is:

1. An organic light-emitting array comprising:
   a substrate having a plurality of sub-pixels, each sub-pixel including an emission portion and a non-emission portion adjacent the emission portion;
   a first electrode provided on at least the emission portion and provided on a portion of the non-emission portion for each sub-pixel;
   a bank provided in the non-emission portion and having a positively inclined portion configured to overlap a portion of the first electrode and a negatively inclined portion configured so as not to overlap the first electrode, wherein the bank has an asymmetrical shape including the positively inclined portion at one side thereof and the negatively inclined portion at the other side thereof so that the bank leans into the negatively inclined portion;
   an organic layer provided on the first electrode and the bank; and
   a second electrode disposed on the organic layer over the plurality of sub-pixels.

2. The organic light-emitting array according to claim 1, wherein the organic layer is separated on the negatively inclined portion of the bank between neighboring sub-pixels.

3. The organic light-emitting array according to claim 2, further comprising an overcoat layer as an interlayer between the substrate and the first electrode, the overcoat layer having a concave area formed in a portion of a thickness thereof so as to correspond to the non-emission portion.

4. The organic light-emitting array according to claim 3, wherein the negatively inclined portion of the bank is provided in a region in which the bank and the concave area of the overcoat layer overlap each other.

5. The organic light-emitting array according to claim 3, wherein the bank is formed of a light-shielding organic material.

6. The organic light-emitting array according to claim 1, wherein the organic layer includes one or more organic emission layers, and common organic layers located respectively under and above the one or more organic emission layers.

7. The organic light-emitting array according to claim 5, wherein the bank includes a portion having a flat top between the positively inclined portion and the negatively inclined portion.

8. The organic light-emitting array according to claim 5, wherein the organic layer is located only in a region of the concave area of the overcoat layer that does not overlap the bank.

9. The organic light-emitting array according to claim 8, further comprising an auxiliary wire provided in the concave area so that a portion thereof overlaps the negatively inclined portion of the bank, the auxiliary wire being formed of the same material as the first electrode.

10. The organic light-emitting array according to claim 9, wherein the second electrode is connected to the auxiliary wire in a region in which a portion of the second electrode overlaps the negatively inclined portion of the bank inside the concave area.

11. An organic light-emitting display device comprising:
    a substrate having a plurality of sub-pixels, each sub-pixel including an emission portion and a non-emission portion adjacent the emission portion;
    a first electrode provided on at least the emission portion and provided on a portion of the non-emission portion for each sub-pixel;
    a bank provided in the non-emission portion and having a positively inclined portion configured to overlap a portion of the first electrode and a negatively inclined portion configured so as not to overlap the first electrode, wherein the bank has an asymmetrical shape including the positively inclined portion at one side thereof and the negatively inclined portion at the other side thereof so that the bank leans into the negatively inclined portion;
    an organic layer provided on the first electrode and the bank;
    a second electrode disposed on the organic layer over the plurality of sub-pixels; and
    a thin-film transistor provided on the substrate in each sub-pixel so as to be connected to the first electrode.

12. An organic light-emitting array comprising:
    a substrate having a plurality of sub-pixels, each sub-pixel including an emission portion and a non-emission portion;
    an overcoat layer on the substrate, and having a concave area formed in the non-emission portion; and
    a bank in the non-emission portion, a first portion of the bank being positioned in the concave area and a second portion of the bank being positioned outside the concave area.

13. The organic light-emitting array according to claim 12, further comprising:

a first electrode provided on at least the emission portion and provided on a portion of the non-emission portion for each sub-pixel;

an organic layer provided on the first electrode and the bank; and a second electrode disposed on the organic layer over the plurality of sub-pixels.

14. The organic light-emitting array according to claim 13, wherein the bank has a positively inclined portion configured to overlap a portion of the first electrode and a negatively inclined portion configured so as not to overlap the first electrode, and wherein the bank has an asymmetrical shape including the positively inclined portion at one side thereof and the negatively inclined portion at the other side thereof so that the bank leans into the negatively inclined portion.

15. The organic light-emitting array according to claim 13, wherein the negatively inclined portion of the bank is provided in a region in which the bank and the concave area of the overcoat layer overlap each other.

16. The organic light-emitting array according to claim 12, wherein the bank is formed of a light-shielding organic material.

17. The organic light-emitting array according to claim 13, wherein the organic layer includes one or more organic emission layers, and common organic layers located respectively under and above the one or more organic emission layers.

18. The organic light-emitting array according to claim 14, wherein the bank includes a portion having a flat top between the positively inclined portion and the negatively inclined portion.

19. The organic light-emitting array according to claim 12, wherein the organic layer is located only in a region of the concave area of the overcoat layer that does not overlap the bank.

20. The organic light-emitting array according to claim 13, wherein the bank comprises two banks separated by a gap, and wherein a portion of the organic layer is on the overcoat layer at the gap.

* * * * *